(12) United States Patent
Jin et al.

(10) Patent No.: US 11,189,739 B1
(45) Date of Patent: Nov. 30, 2021

(54) SOLAR CELL

(71) Applicants: Jinko Green Energy (Shanghai) Management Co., LTD., Shanghai (CN); ZHEJIANG JINKO SOLAR CO., LTD., Haining (CN)

(72) Inventors: Jingsheng Jin, Shanghai (CN); Bike Zhang, Shanghai (CN); Xinyu Zhang, Shanghai (CN)

(73) Assignees: Jinko Green Energy (Shanghai) Management Co., LTD., Shanghai (CN); ZHEJIANG JINKO SOLAR CO., LTD., Haining (CN)

( * ) Notice: Subject to any disclaimer, the term of this patent is extended or adjusted under 35 U.S.C. 154(b) by 0 days.

(21) Appl. No.: 17/112,850

(22) Filed: Dec. 4, 2020

(30) Foreign Application Priority Data

Nov. 19, 2020 (CN) .......................... 202011308762.X

(51) Int. Cl.
*H01L 31/0224* (2006.01)
*H01L 31/0216* (2014.01)

(52) U.S. Cl.
CPC ................ *H01L 31/022425* (2013.01); *H01L 31/02167* (2013.01)

(58) Field of Classification Search
CPC ....... H01L 31/02167; H01L 31/022425; H01L 31/0256
See application file for complete search history.

(56) References Cited

U.S. PATENT DOCUMENTS

| | | | | |
|---|---|---|---|---|
| 2010/0275995 A1* | 11/2010 | Kaes | ..................... | H01L 31/068 136/258 |
| 2016/0126368 A1 | 5/2016 | Lee et al. | | |

(Continued)

FOREIGN PATENT DOCUMENTS

| CN | 101465410 B | 3/2011 |
|---|---|---|
| CN | 203760486 U | 8/2014 |

(Continued)

OTHER PUBLICATIONS

Jinko Green Energy (Shanghai) Management Co., LTD., et al., Notice of Reasons for Refusal (and English Translation), JP2020-203914, dated Feb. 19, 2021, 10 pgs.

(Continued)

*Primary Examiner* — Christina Chern
(74) *Attorney, Agent, or Firm* — USCH Law, PC

(57) ABSTRACT

The present disclosure provide a solar cell, including: a substrate, an interface passivation layer covering a rear surface of the substrate, and an electrode disposed at a side of the interface passivation layer facing away from the substrate, the interface passivation layer including a first interface passivation sub-layer corresponding to a portion of the interface passivation layer between adjacent electrodes, and a second interface passivation sub-layer corresponding to a portion of the interface passivation layer where disposed between the substrate and the electrode; a field passivation layer, at least partially disposed between the interface passivation layer and the electrode; and a conductive enhancement layer, at least partially disposed at a side of the first interface passivation sub-layer away from the substrate to enable carriers in the first interface passivation sub-layer to flow to the electrode, where a resistivity of the conductive enhancement layer is smaller than a resistivity of the field passivation layer.

9 Claims, 4 Drawing Sheets

(56) References Cited

U.S. PATENT DOCUMENTS

| | | | | |
|---|---|---|---|---|
| 2017/0062633 | A1* | 3/2017 | Carlson | ........... H01L 31/022441 |
| 2018/0138334 | A1* | 5/2018 | Lee | ................. H01L 31/022425 |

FOREIGN PATENT DOCUMENTS

| | | | |
|---|---|---|---|
| CN | 105826428 | A | 8/2016 |
| CN | 106992229 | A | 7/2017 |
| CN | 107968127 | A | 4/2018 |
| CN | 108074989 | A | 5/2018 |
| CN | 207967020 | U | 10/2018 |
| EP | 3576160 | A1 | 12/2019 |
| GB | 2503515 | A | 1/2014 |
| JP | 2003-124483 | A | 4/2003 |
| JP | 2010-080887 | A | 4/2010 |
| JP | 2012-234847 | A | 11/2012 |
| JP | 2014-204128 | A | 10/2014 |
| JP | 2016-092424 | A | 5/2016 |
| JP | 2018-082162 | A | 5/2018 |
| JP | 2018082163 | A | 5/2018 |
| JP | 2018-093168 | A | 6/2018 |
| KR | 2016-0020859 | A | 2/2016 |
| KR | 2018-0018895 | A | 2/2018 |
| KR | 2018-0103038 | A | 9/2018 |
| WO | WO 2017/163498 | A1 | 9/2017 |
| WO | WO 2019/181834 | A1 | 9/2019 |

OTHER PUBLICATIONS

Jinko Green Energy (Shanghai) Management Co., LTD., et al., Extended European Search Report, EP20211275.1, dated May 7, 2021, 12 pgs.

Jinko Green Energy (Shanghai) Management Co., Ltd., et al., JP First Office Action, JP2020-203914, dated Feb. 19, 2021, 4 pgs.

Akiyama et al., "Fabrication of silicon heterojunction solar cells with a boron-doped a-Si:H layer formed by catalytic impurity doping," *AIP Advances,* vol. 9, No. 11, Nov. 15, 2019, 6 pgs.

Chebotareva et al., "Bifacial silicon heterojunction solar cells with advanced Ag-free multi-wire metallization attached to ITO layers using new transparent conductive PAEK copolymers," *Solar Energy,* vol. 193, Oct. 22, 2019, 9 pgs.

Jinko Green Energy (Shanghai) Management Co., Ltd., et al., CN First Office Action, CN 202011308762.X, dated Jul. 15, 2021, 6 pgs.

Jinko Green Energy (Shanghai) Management Co., Ltd., et al., EP First Office Action, EP 20211275.1, dated Sep. 13, 2021, 8 pgs.

Jinko Green Energy (Shanghai) Management Co., Ltd., et al., Notice of acceptance for your patent application, AU 2020281074, dated Jul. 15, 2021, 4 pgs.

\* cited by examiner

SOLAR CELL

CROSS-REFERENCE TO RELATED APPLICATION

The present application claims the benefit of priority to Chinese Patent Application No. 202011308762.X filed on Nov. 19, 2020, which is incorporated herein by reference in its entirety.

TECHNICAL FIELD

Embodiments of the present disclosure relate to a photovoltaic technique, in particular to a solar cell.

BACKGROUND

With the continuous development of the solar cell technology, a recombination loss of a metal contact area has become one of important factors restricting further improvement of conversion efficiency of a solar cell. In order to improve the conversion rate of the solar cell, the solar cell is usually passivated by a passivated contact in order to reduce the recombination therein and on the surface of the solar cell. Existing passivated contact cells include a heterojunction with intrinsic thin-layer (HIT) cell and a tunnel oxide passivated contact (TOPCon) cell.

However, the conversion efficiency of the existing passivated contact cells still needs to be improved.

SUMMARY

Some embodiments of the present disclosure provide a solar cell with improved conversion efficiency.

An aspect of the present disclosure provides a solar cell, including: a substrate; an interface passivation layer on a rear surface of the substrate, wherein the interface passivation layer comprises a first interface passivation sub-layer and a second interface passivation sub-layer; at least one electrode disposed at a side of the interface passivation layer facing away from the substrate, the first interface passivation sub-layer corresponding to a portion of the interface passivation layer between adjacent electrodes, and the second interface passivation sub-layer corresponding to a portion of the interface passivation layer between the substrate and the at least one electrode; a field passivation layer, at least partially disposed between the interface passivation layer and the at least one electrode; and a conductive enhancement layer, at least partially disposed at a side of the first interface passivation sub-layer facing away from the substrate, and configured to enable carriers in the first interface passivation sub-layer to flow to the at least one electrode, wherein a resistivity of a material of the conductive enhancement layer is smaller than a resistivity of a material of the field passivation layer, and the resistivity of the material of the conductive enhancement layer is smaller than 0.001 Ω·cm.

In some embodiments, the conductive enhancement layer is configured to cover at least part of a surface of the first interface passivation sub-layer facing away from the substrate, and the field passivation layer is configured to cover a surface of the conductive enhancement layer facing away from the substrate.

In some embodiments, the field passivation layer is configured to cover a surface of the second interface passivation sub-layer facing away from the substrate; at least part of the conductive enhancement layer is disposed between adjacent electrodes, and the conductive enhancement layer is in contact with a side wall of the at least one electrode. In this way, the carriers may flow to the electrode completely through the conductive enhancement layer without passing through the field passivation layer, which is beneficial to reduce a series resistance on a transmission path of the carriers, shorten the transmission path of the carriers, enable the carriers to flow to the electrode at a relatively fast transmission rate and a relatively low transmission loss, and ensure that the solar cell has a relatively high conversion efficiency.

In some embodiments, the field passivation layer is configured to cover a surface of the interface passivation layer facing away from the substrate, wherein the field passivation layer disposed between adjacent electrodes is a first field passivation sub-layer, and the conductive enhancement layer is configured to cover at least part of the surface of the first field passivation sub-layer facing away from the substrate. Since an arrangement of the conductive enhancement layer does not change a vertical distance between the field passivation layer and the substrate, the field passivation layer still has a relatively good field passivation effect under a condition that a concentration of a doped ion in the field passivation layer remains unchanged, thus ensuring a selective transmission of the carriers and further ensuring that the solar cell has the relatively high conversion efficiency.

In some embodiments, the at least one electrode is configured to penetrate through the conductive enhancement layer and is in contact with the field passivation layer.

In some embodiments, a groove is provided within the first field passivation sub-layer, and the conductive enhancement layer is configured to fill the groove. In this way, it is beneficial to ensure that the solar cell has a relatively thin thickness while having the relatively high conversion efficiency.

In some embodiments, the conductive enhancement layer includes a first conductive enhancement sub-layer and a second conductive enhancement sub-layer disposed in sequence, the first conductive enhancement sub-layer is configured to cover a surface of the groove, a contact resistance between the first conductive enhancement sub-layer and the field passivation layer is smaller than a contact resistance between the second enhancement sub-layer and the field passivation layer, and a resistivity of the second enhancement sub-layer is smaller than a resistivity of the first enhancement sub-layer.

In some embodiments, the field passivation layer is configured to expose part of a surface of the first interface passivation sub-layer, the conductive enhancement layer is in contact with the exposed part of the surface of the first interface passivation sub-layer, and the resistivity of the material of the conductive enhancement layer is smaller than a resistivity of a material of the interface passivation layer.

In some embodiments, the first interface passivation sub-layer includes a plurality of discontinuous local surfaces exposed by the field passivation layer, and the conductive enhancement layer is in contact with the plurality of discontinuous local surfaces.

In some embodiments, the conductive enhancement layer has a field passivation capability. In this way, a field passivation capability of the field passivation layer may be compensated to a certain extent, so as to ensure that the solar cell has a relatively high field passivation effect as a whole, thereby further ensuring that the solar cell has the relatively high conversion efficiency.

In some embodiments, the resistivity of the material of the conductive enhancement layer is further smaller than a resistivity of a material of the interface passivation layer.

In some embodiments, a material type of the conductive enhancement layer includes at least one of: a conductive polymer, a metal silicide or an oxidized conductor.

In some embodiments, the conductive enhancement layer is a multilayer structure comprising a plurality of film layers, wherein the plurality of film layers are disposed in a direction perpendicular to the surface of the substrate.

In some embodiments, the conductive enhancement layer includes a first conductive enhancement sub-layer and a second conductive enhancement sub-layer disposed in sequence in a direction away from the substrate; wherein a contact resistance between the first conductive enhancement sub-layer and the interface passivation layer is smaller than a contact resistance between the second conductive enhancement sub-layer and the interface passivation layer; a resistivity of the second conductive enhancement sub-layer is smaller than a resistivity of the first conductive enhancement sub-layer.

In some embodiments, the conductive enhancement layer further includes a third conductive enhancement sub-layer that is disposed between the second conductive enhancement sub-layer and the field passivation layer; wherein a contact resistance between the third conductive enhancement sub-layer and the field passivation layer is smaller than a contact resistance between the second conductive enhancement sub-layer and the field passivation layer; the resistivity of the second conductive enhancement sub-layer is smaller than a resistivity of the third conductive enhancement sub-layer.

In some embodiments, the conductive enhancement layer is in contact with the second electrode.

In some embodiments, the conductive enhancement layer is separated from the second electrode by an air gap.

In some embodiments, the groove is arc-shaped, and an opening width of the groove is at least equal to a width of the first field passivation sub-layer and a width of the first interface passivation sub-layer in an arrangement direction of adjacent second electrodes.

In some embodiments, the groove has a square shape, and the opening width of the groove is smaller than a thickness of the first field passivation sub-layer.

Compared with the existing technology, the technical solution provided by the embodiments of the present disclosure has the following advantages:

In the above technical solutions, since the resistivity of the material of the conductive enhancement layer is smaller than the resistivity of the material of the field passivation layer, the conductive enhancement layer serves as a path for the carriers in the first interface passivation sub-layer to flow to the electrode, which is conducive to enabling the carriers to flow to the electrode at the relatively fast transmission rate and the relatively low transmission loss, thereby improving the conversion efficiency of the solar cell.

BRIEF DESCRIPTION OF THE DRAWINGS

One or more embodiments are described as examples with reference to the corresponding figures in the accompanying drawings, and the examples do not constitute a limitation to the embodiments. Elements with the same reference numerals in the accompanying drawings represent similar elements. The figures in the accompanying drawings do not constitute a proportion limitation unless otherwise stated.

DETAILED DESCRIPTION

Figure 1:
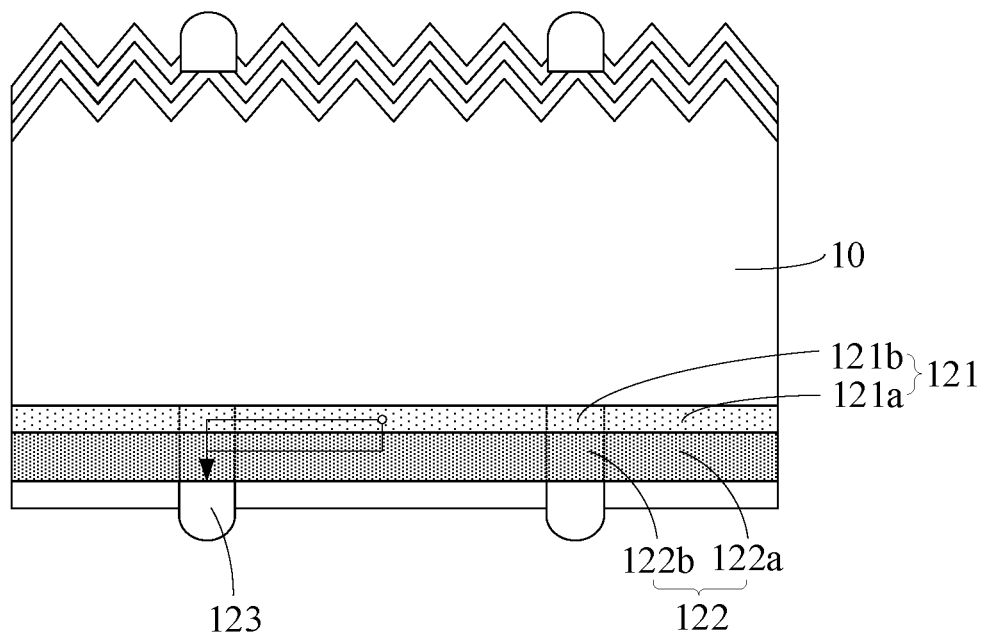
FIG. 1 is a schematic structural diagram of a solar cell.

Referring to FIG. 1, FIG. 1 is a schematic structural diagram of a solar cell.

As shown in FIG. 1, the solar cell includes a substrate 10, and an interface passivation layer 121, a field passivation layer 122 and electrode(s) 123 that are sequentially disposed on a rear surface of the substrate 10. The interface passivation layer 121 includes a first interface passivation sub-layer 121a corresponding to the interface passivation layer between adjacent electrodes 123 and a second interface passivation sub-layer 121b corresponding to the interface passivation layer between the electrode 123 and the substrate 10. The field passivation layer 122 includes a first field passivation sub-layer 122a corresponding to the field passivation layer between adjacent electrodes 123 and a second field passivation sub-layer 122b corresponding to the field passivation layer between the electrode 123 and the substrate 10.

A transmission path of carriers to the electrode 123 is as follows: the carriers transmitted from the substrate 10 to the first interface passivation sub-layer 121a need to be vertically transmitted to the first field passivation sub-layer 122a, then laterally transmitted through the first field passivation sub-layer 122a, and finally reach a surface of the electrode 123 through the second field passivation sub-layer 122b. Alternatively, the carriers need to be laterally transmitted within the first interface passivation sub-layer 121a, and then vertically pass through the second field passivation sub-layer 122b after reaching the second interface passivation sub-layer 121b to reach the surface of electrode 123. Since the interface passivation layer 121 and the field passivation layer 122 have a relatively high resistivity and a poor conductivity, a series resistance of the solar cell is relatively large, and a lateral transmission resistance for majority carriers is relatively large, problems such as a relatively slow transmission rate, a long transmission time, and a relatively large transmission loss will occur in the lateral transmission process of the majority carriers, thus leading to a relatively low conversion efficiency of the solar cell.

In order to avoid the above technical problems, generally, a distance between adjacent electrodes 123 may be set smaller, however, which may increase a surface recombination area between the electrode 123 and the field passivation layer 122, thus causing negative impact on the field passivation effect of the field passivation layer 122 and the conversion efficiency of the solar cell. In addition, the smaller the distance between the adjacent electrodes 123 may cause that more electrodes 123 need be provided on the field passivation layer 122 with the same width, that is, more metal electrode materials need to be consumed in the fabrication of the solar cell, and a fabrication cost of the solar cell is increased.

It should be noted that the two transmission paths mentioned above are only a specific example of the transmission path of the carriers, and the actual transmission path of the carriers may also be an oblique transmission. In this case, the actual transmission path of the carriers may be equivalent to the lateral transmission and the vertical transmission, that is, the carriers may be considered to be laterally transmitted in the first interface passivation sub-layer 121a or the first field passivation sub-layer 122a.

Embodiments of the present disclosure provide a solar cell, in which a conductive enhancement layer with a relatively low resistivity is arranged on a side of the first interface passivation sub-layer away from the substrate, so as to serve as a path for the carriers in the first interface passivation sub-layer to flow to the electrode, which is conducive to enabling the carriers to flow to the electrode at a relatively fast rate and with a relatively small loss, thereby improving a conversion efficiency of the solar cell.

The embodiments of the present disclosure will be described in detail below with reference to the accompanying drawings in order to make the objectives, technical solutions and advantages of the present disclosure clearer. However, those skilled in the art may appreciate that, in the various embodiments of the present disclosure, numerous technical details are set forth in order to provide the reader with a better understanding of the present disclosure. However, the technical solutions claimed in the present disclosure may be implemented without these technical details and various changes and modifications based on the following embodiments.

Figure 2:
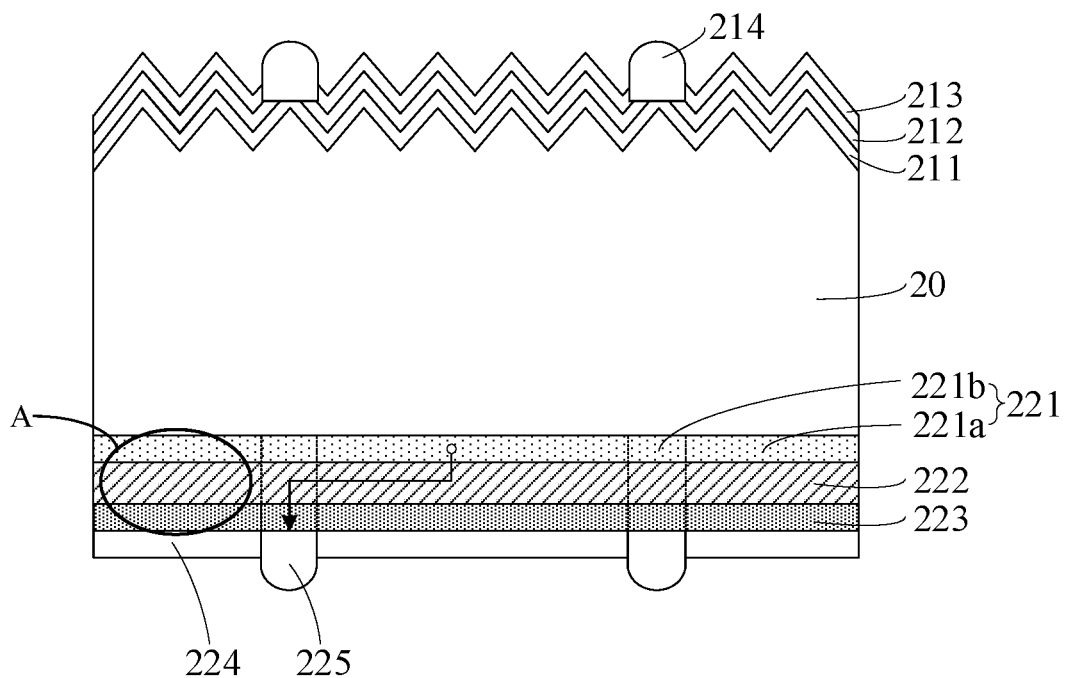
FIG. 2 is a schematic structural diagram of a solar cell according to the present disclosure.

FIG. 2 is a schematic structural diagram of a solar cell provided in the present disclosure.

Referring to FIG. 2, the solar cell includes a substrate 20, an interface passivation layer 221 covering a rear surface of the substrate 20, a second electrode 225 disposed at a side of the interface passivation layer 221 facing away from the substrate 20, a field passivation layer 223, and a conductive enhancement layer 222. The interface passivation layer 221 includes a first interface passivation sub-layer 221a and a second interface passivation sub-layer 221b. The first interface passivation sub-layer 221a corresponds to a portion of the interface passivation layer between adjacent second electrodes 225 and the second interface passivation sub-layer 221b corresponds to a portion of the interface passivation layer between the substrate 20 and the second electrode 225. The field passivation layer 223 is at least partially disposed between the interface passivation layer 221 and the second electrode 225. The conductive enhancement layer 222 is at least partially disposed at a side of the first interface passivation sub-layer 221a away from the substrate 20, for carriers in the first interface passivation sub-layer 221a to flow to the second electrode 225. A resistivity of a material of the conductive enhancement layer 222 is smaller than a resistivity of a material of the field passivation layer 223, and the resistivity of the material of the conductive enhancement layer 222 is smaller than 0.001 Ω·cm.

The solar cell further includes an emitter 211, a first passivation film 212, an antireflection film 213, and a first electrode 214 sequentially disposed on a front surface of the substrate 20, and a second passivation film 224 disposed at a side of the field passivation layer 223 away from the substrate 20.

As used herein, a front surface refers to a light-receiving surface that faces to the sun during a normal operation, and a real surface of the substrate is opposite to the front surface.

The substrate 20 and the emitter 211 form a PN junction. Specifically, if the substrate 20 is P-type, the emitter 211 may be N-type; and if the substrate 20 is N-type, the emitter may be P-type. Optionally, a material of the substrate 20 may include a semiconductor material such as a monocrystalline silicon, a polycrystalline silicon, a monocrystalline-like silicon, a perovskite, etc.

A type of a doped ion of the field passivation layer 223 is the same as a type of a doped ion of the substrate 20. Specifically, when the substrate 20 is an N-type silicon wafer, the field passivation layer 223 is an N-type doped layer (such as an N-type doped polysilicon), and the doped ion includes group V elements such as a phosphorus ion. When the substrate 20 is a P-type silicon wafer, the field passivation layer 223 is P-type doped (such as a P-type doped polysilicon), and the doped ion includes group III elements such as a boron ion.

The materials of the first passivation film 212 and the second passivation film 224 include one or more materials such as a silicon nitride, a silicon oxynitride, a silicon carbonitride, a titanium oxide, a hafnium oxide, an aluminum oxide, etc. A material of the antireflection film 213 may include one or more materials such as the silicon nitride, the silicon oxynitride, the silicon carbonitride, etc. The first electrode 214 penetrates through the antireflection film 213 and the first passivation film 212 and is connected with the emitter 211. The second electrode 225 penetrates through the second passivation film 224 and is in contact with the field passivation layer 223. The first electrode 214 may be a silver-aluminum electrode, and the second electrode 225 may be a silver electrode.

In this embodiment, in a direction away from the rear surface of the substrate 20, the interface passivation layer 221, the conductive enhancement layer 222, the field passivation layer 223 and the second passivation film 224 are sequentially disposed. The second electrode 225 penetrates through the second passivation film 224 and is in contact with the field passivation layer 223.

Since the second electrode 225 is attractive to majority carriers in the interface passivation layer 221, the majority carriers in the interface passivation layer 221 may orderly pass through the conductive enhancement layer 222 and the field passivation layer 223, that is, flow to the second electrode 225 in a form of an orderly current. Accordingly, since the current flows in an orderly manner between the interface passivation layer 221, the conductive enhancement layer 222 and the field passivation layer 223, it may be considered that the conductive enhancement layer 222 is in an electrical contact with the interface passivation layer 221, and the conductive enhancement layer 222 is used for the carriers in the first interface passivation sub-layer 221a to flow to the second electrode 225.

According to the above description, the conductive enhancement layer 222 serves as a path for the carriers in the first interface passivation sub-layer 221a to flow to the second electrode 225. Specifically, in the process of flowing to the second electrode 225, majority carriers in the first interface passivation sub-layer 221a may be vertically transmitted into the conductive enhancement layer 222 first, then laterally transmitted through the conductive enhancement layer 222. Subsequently, the majority carriers only need to vertically pass through the field passivation layer 223 to reach the second electrode 225, thus completing a photoelectric conversion.

That is to say, in the process of flowing to the second electrode 225, the majority carriers in the first interface passivation sub-layer 221a no longer need be transmitted laterally in the field passivation layer 223, but may be transmitted laterally through the conductive enhancement layer 222 with a lower resistivity. In this way, it is beneficial to reduce a lateral transmission resistance of the majority carriers, thereby improving a transmission rate of the majority carriers and reducing a transmission loss of the majority carriers, and further improving a conversion efficiency of the solar cell.

In this embodiment, the interface passivation layer 221 may be a dielectric layer with a tunneling effect, for example, a tunneling oxide layer (such as the silicon oxide, the aluminum oxide, the hafnium oxide, etc.), a tunneling nitride layer (such as the silicon nitride), etc. In some embodiments, a thickness of the interface passivation layer 221 is relatively thin in order to achieve the tunneling effect, for example, the thickness is 1-4 nm. In this embodiment, a resistance of the material of the conductive enhancement layer 222 is smaller than 0.001 Ω·cm, for example, 0.0005 Ω·cm, 0.0002 Ω·cm or 0.00001 Ω·cm.

In this embodiment, the resistivity of the material of the conductive enhancement layer 222 is also smaller than a resistivity of a material of the interface passivation layer 221. Since the carriers always tend to be transmitted along a path with the lowest resistance during the transmission process, when the resistivity of the conductive enhancement layer 222 is smaller than that of the interface passivation layer 221, the majority carriers in the first interface passivation sub-layer 221a may be preferentially transmitted laterally through the conductive enhancement layer 222, which is conducive to further improving an average transmission rate of the majority carriers, reducing an average transmission resistance of the majority carriers and improving the conversion efficiency of the solar cell.

In this embodiment, the material type of the conductive enhancement layer 222 includes a conductive polymer, a metal silicide or an oxidized conductor. Specifically, the conductive polymer includes a polyaniline, a polypyrrole, a polythiophene, etc., the metal silicide includes a titanium tungsten silicide, a titanium silicide, a cobalt silicide, a nickel silicide, etc., and the oxidized conductor includes a indium tin oxide (ITO), an aluminum-doped zinc oxide (AZO), a CdOx, an InOx, a SnOx, a ZnO, etc.

Figure 3:
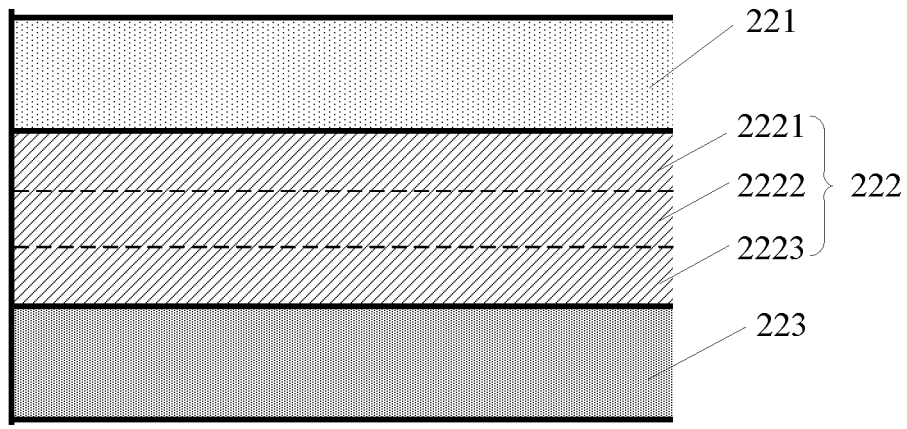
FIG. 3 is an enlarged view of part A in FIG. 2.

In this embodiment, as shown in FIG. 3, the conductive enhancement layer 222 has a multilayer structure. A plurality of film layers in the multilayer structure are disposed in a direction perpendicular to the surface of the substrate 20, and materials of different film layers are the same or different. Herein, a single film layer may be composed of a single material or multiple materials, so as to better meet a preset performance requirement.

Specifically, the conductive enhancement layer 222 may include a first conductive enhancement sub-layer 2221 and a second conductive enhancement sub-layer 2222 disposed in sequence in a direction away from the substrate 20. A contact resistance between the first conductive enhancement sub-layer and the interface passivation layer 221 is smaller than a contact resistance between the second conductive enhancement sub-layer and the interface passivation layer 221. A resistivity of the second conductive enhancement sub-layer is smaller than a resistivity of the first conductive enhancement sub-layer. In this way, it is beneficial to reduce a loss of the majority carriers when passing through an interface between the interface passivation layer 221 and the conductive enhancement layer 222, thereby increasing the number of the majority carriers that may reach a surface of the second electrode 225 and improving the conversion efficiency of the solar cell.

Further, the conductive enhancement layer 222 may further include a third conductive enhancement sub-layer 2223 which is disposed between the second conductive enhancement sub-layer and the field passivation layer 223. A contact resistance between the third conductive enhancement sub-layer and the field passivation layer 223 is smaller than a contact resistance between the second conductive enhancement sub-layer and the field passivation layer 223. The resistivity of the second conductive enhancement sub-layer is smaller than a resistivity of the third conductive enhancement sub-layer. In this way, it is beneficial to reduce the loss of the majority carriers when passing through an interface between the conductive enhancement layer 222 and the field passivation layer 223, thereby further increasing the number of the majority carriers that may reach the surface of the second electrode 225 and improving the conversion efficiency of the solar cell.

The conductive enhancement layer 222 may be formed by a high-temperature thermal diffusion process, an ion implantation process, a physical vapor deposition (PVD) process, a chemical vapor deposition (CVD) process, an atomic layer deposition (ALD) process, a sol-gel method and other methods.

Figure 4:
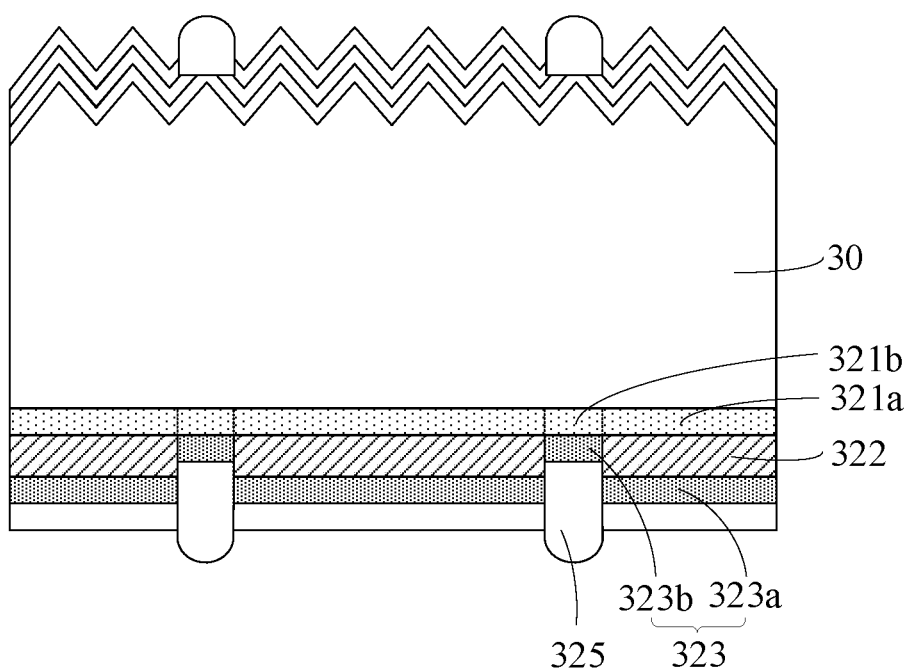
FIG. 4 is a schematic structural diagram of a solar cell according to the present disclosure.

In some embodiments, a field passivation layer may cover a surface of a second interface passivation sub-layer facing away from the substrate. The following will be described in detail below with reference to FIG. 4. Parts that are the same as or corresponding to the previous embodiment may refer to the corresponding description of the previous embodiment, and will not be repeated below.

In this embodiment, a conductive enhancement layer 322 covers a surface of a first interface passivation sub-layer 321a facing away from a substrate 30. A second field passivation sub-layer 323b covers part of a surface of a second interface passivation sub-layer 321b facing away from the substrate 30. A second electrode 325 is in contact with a surface of the second field passivation sub-layer 323b facing away from the substrate 30. At least part of the conductive enhancement layers 322 is disposed between adjacent second electrodes 325. The conductive enhancement layer 322 is in contact with a side wall of the second electrode 325. Herein, the second field passivation sub-layer 323b is closer to the substrate 30 than the first field passivation sub-layer 323a, which is beneficial to enhance an overall field passivation effect of the field passivation layer 323. Besides, the conductive enhancement layer 322 is in contact with the second electrode 325, and majority carriers may directly reach a surface of the second electrode 325 through the conductive enhancement layer 322 without passing through the field passivation layer 323, which is beneficial to further reduce a transmission resistance of the majority carriers and reduce a transmission loss of the majority carriers.

In this embodiment, in a direction perpendicular to a rear surface of the substrate 30, a thickness of the first field passivation sub-layer 323a is the same as a thickness of the second field passivation sub-layer 323b, and a thickness of the conductive enhancement layer 322 is greater than a thickness of the second field passivation sub-layer 323b. In other embodiments, the thickness of the second field passivation sub-layer is smaller than the thickness of the first field passivation sub-layer, and a contact area between the second electrode and the conductive enhancement layer is controlled by controlling the thickness of the second field passivation sub-layer.

In this embodiment, the first field passivation sub-layer 323a is separated from the second field passivation sub-layer 323b. In other embodiments, the first field passivation sub-layer is connected with the second field passivation sub-layer. Specifically, a width of an opening in the conductive enhancement layer is widened and a deposition process is adopted to simultaneously form the first field passivation sub-layer and the second field passivation sub-layer. At this time, the first field passivation sub-layer also covers a side wall of the conductive enhancement layer. The first field passivation sub-layer separates the conductive enhancement layer from the second electrode, and a width of the second electrode remains unchanged. Alternatively, the deposition process is directly performed to simultaneously form the first field passivation sub-layer and the second field passivation sub-layer. At this time, the second field passivation sub-layer also covers the side wall of the conductive enhancement layer. The second field passivation sub-layer separates the conductive enhancement layer from the second electrode, and the width of the second electrode is narrowed.

In this embodiment, in a horizontal interface parallel to the rear surface of the substrate 30, the conductive enhancement layer 322 has the same material at different positions. In other embodiments, in the horizontal interface parallel to the rear surface of the substrate, the conductive enhancement layer has different materials at different positions. Specifically, by adjusting a material of a surface layer where the conductive enhancement layer is in contact with the second electrode, the conductive enhancement layer has a relatively small series resistance in a lateral direction, and a contact resistance between the conductive enhancement layer and the second electrode is relatively small, thereby reducing the loss of the majority carriers passing through the interface and improving the conversion efficiency of the solar cell.

In other embodiments, the thickness of the second field passivation sub-layer may also be greater than the thickness of the conductive enhancement layer, that is, the second electrode does not contact with the conductive enhancement layer.

Figure 5:
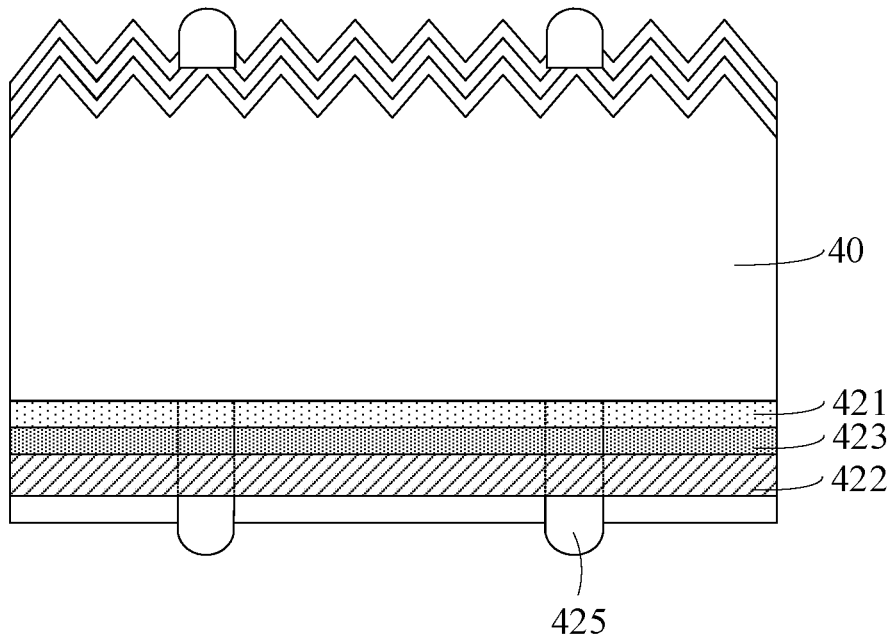
FIG. 5 is a schematic structural diagram of a solar cell according to the present disclosure.

In some embodiments, a field passivation layer may cover a surface of an interface passivation layer facing away from the substrate. The following will be described in detail below with reference to FIG. 5. Parts that are the same as or corresponding to the previous embodiment may refer to the corresponding description of the previous embodiment, and will not be repeated below.

In this embodiment, an interface passivation layer 421, a field passivation layer 423, and a conductive enhancement layer 422 are sequentially disposed in a direction perpendicular to a rear surface of a substrate 40. A second electrode 425 is in contact with a surface of the conductive enhancement layer 422 facing away from the substrate 40. Since the conductive enhancement layer 422 is disposed at a side of the field passivation layer 423 facing away from the substrate 40, an arrangement of the conductive enhancement layer 422 may not increase a distance between the field passivation layer 423 and the substrate 40, thus making the field passivation layer 423 have a good field passivation effect.

Figure 6:
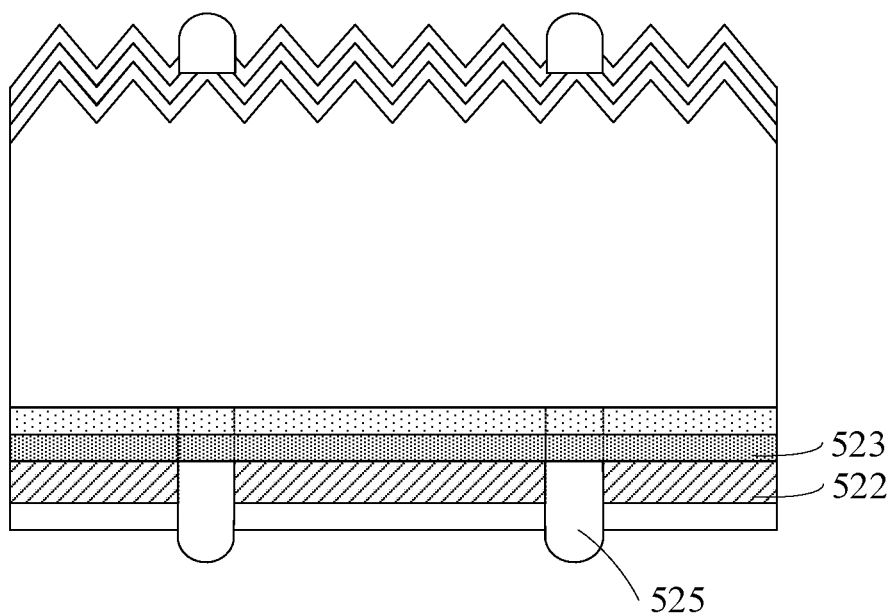
FIG. 6 is a schematic structural diagram of a solar cell according to the present disclosure.

In other embodiments, referring to FIG. 6, a second electrode 525 may penetrate through a conductive enhancement layer 522 and contacts a field passivation layer 523, which is beneficial to shorten a transmission path of majority carriers and reduce a transmission resistance of the majority carriers, thereby improving a conversion efficiency of the solar cell.

Herein, shortening the transmission path of the majority carriers and reducing the transmission resistance of the majority carriers include: when the second electrode 525 is only in contact with the conductive enhancement layer 522, the majority carriers need to pass through an interface between the field passivation layer 523 and the conductive enhancement layer 522 and an interface between the conductive enhancement layer 522 and the second electrode 525 so as to enter the second electrode 525. When the second electrode 525 is in contact with the field passivation layer 523, the majority carriers only need to pass through the interface between the field passivation layer 523 and the second electrode 525 to enter the second electrode 525.

In this embodiment, the conductive enhancement layer 522 is in contact with the second electrode 525. In other embodiments, in order to reduce a surface recombination loss of the solar cell, an air gap may be used to separate the conductive enhancement layer from the second electrode. Specifically, after forming the second electrode penetrating the conductive enhancement layer, the conductive enhancement layer in contact with the second electrode may be further etched to form the air gap.

Figure 7:
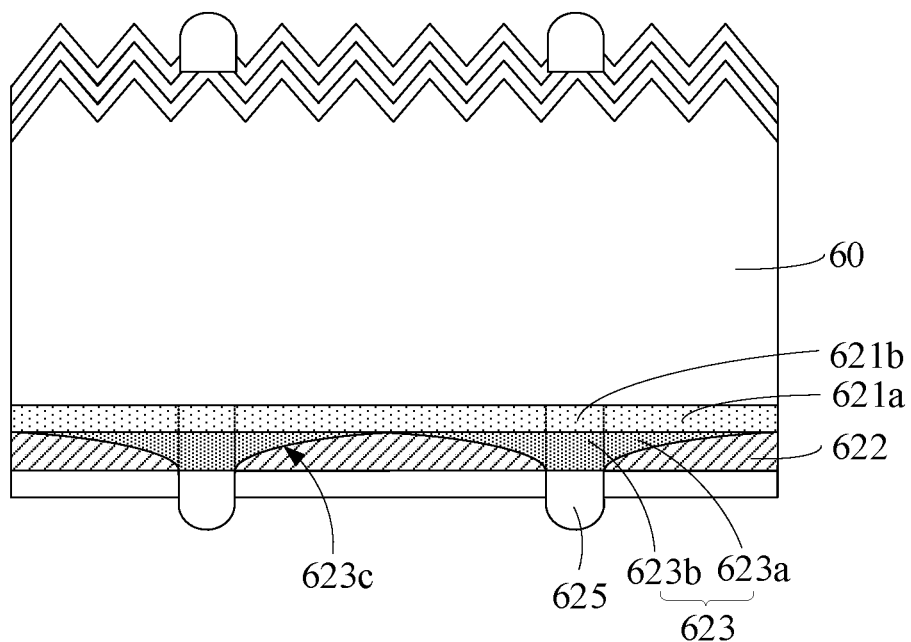
FIG. 7 is a schematic structural diagram of a solar cell according to the present disclosure.

In some embodiments, a groove may be provided within a first field passivation sub-layer, and a conductive enhancement layer fills the groove. The following will be described in detail below with reference to FIG. 7. Parts that are the same as or corresponding to the previous embodiment may refer to the corresponding description of the previous embodiment, and will not be repeated below.

In this embodiment, a groove 623c is provided within a first field passivation sub-layer 623a, and a conductive enhancement layer 622 fills the groove 623c. In this way, a transmission path of majority carriers vertically transmitted from a first interface passivation sub-layer 621a to the conductive enhancement layer 622 may be shortened, thereby reducing a transmission resistance of the majority carriers, shortening a transmission time, reducing a transmission loss and improving a conversion rate of the solar cell. Besides, since an arrangement of the conductive enhancement layer 622 does not increase a thickness of the solar cell in a direction perpendicular to a surface of a substrate 60, it may ensure that the solar cell has a relatively thin thickness and a relatively small size.

In this embodiment, the groove 623c is an arc-shaped groove with an arc-shaped side wall and a bottom surface, and an opening width of the groove 623c is equal to a width of the first field passivation sub-layer 623a and a width of the first interface passivation sub-layer 621a in an arrangement direction of adjacent second electrodes 625. In other embodiments, the groove is a square groove with a vertical side wall and a horizontal bottom surface. Alternately, the opening width of the groove may be smaller than a thickness of the first field passivation sub-layer. Alternately, the conductive enhancement layer may not fully fill the groove.

Herein, the arc-shaped groove may be formed by a wet etching process, and the square groove may be formed by a dry etching process.

It should be noted that the field passivation layer 623 may also have the groove 623c with the opening width larger than the width of the first field passivation sub-layer 623a. In this way, the conductive enhancement layer 622 is in contact with the second electrode 625, and the majority carriers do not need to pass through a second field passivation sub-layer 623b with a relatively high resistivity, which is conducive to reducing the transmission resistance of the majority carriers, reducing the transmission loss of the majority carriers and improving the conversion efficiency of the solar cell.

In this embodiment, the conductive enhancement layer 622 includes a first conductive enhancement sub-layer (not shown) and a second conductive enhancement sub-layer (not shown) which are sequentially disposed in a direction away from the substrate 60. The first conductive enhancement sub-layer covers a surface of the groove 623c. A contact resistance between the first conductive enhancement sub-layer and the field passivation layer is smaller than a contact resistance between the second conductive enhancement sub-layer and the field passivation layer. A resistivity of a material of the second conductive enhancement sub-layer is less than a resistivity of a material of the first conductive enhancement sub-layer.

In this embodiment, a doped ion concentration of a surface layer of a side wall and bottom of the groove 623c is smaller than a doped ion concentration of a surface layer of the second field passivation sub-layer 623b facing away from the substrate 60, thereby weakening a light absorption ability of the second field passivation sub-layer 623b and improving the conversion efficiency of the solar cell. In other embodiments, the doped ion concentration of the surface layer of the side wall and the bottom of the groove is equal to the doped ion concentration of the surface layer of the second field passivation sub-layer facing away from the substrate. Since a surface of the groove is relatively close to a rear surface of the substrate, the doped ion concentration of the surface layer of the groove and the rear surface of the second field passivation sub-layer are set to be same, which is conductive to compensating for the problem of a weakening of a field passivation effect caused by a partial loss of the first field passivation sub-layer, and ensuring that the first field passivation sub-layer has a good field passivation effect.

Specifically, in this embodiment, after a polysilicon layer is formed on a surface of the interface passivation layer, the doped ion is implanted into a surface layer of the polysilicon layer facing away from the substrate 60, and the doped ion may gradually diffuse toward the substrate 60 due to an existence of a concentration difference, thereby forming the field passivation layer 623. After forming the field passivation layer 623, the wet etching process is performed on the first field passivation sub-layer 623a to form the arc-shaped groove 623c, and the etching is continued until the surface of the first interface passivation sub-layer 621a is exposed. In other embodiments, after the polysilicon layer is formed, part of the polysilicon layer may be etched to form a groove, and then the ion is implanted into a surface layer of the polysilicon layer with the groove away from the substrate to form the field passivation layer.

In this embodiment, the first field passivation sub-layer 623a exposes part of the surface of the first interface passivation sub-layer 621a. The conductive enhancement layer 622 filled in the groove 623 is in contact with the exposed part of the surface of the first interface passivation sub-layer 621a. A resistivity of a material of the conductive enhancement layer 622 is smaller than a resistivity of a material of the first interface passivation sub-layer 621a. In this way, the majority carriers may be directly transmitted from the first interface passivation sub-layer 621a to the conductive enhancement layer 622 without passing through the field passivation layer 623 with a relatively large resistivity, which is conductive to reducing the transmission resistance of the majority carriers, reducing the transmission loss of the majority carriers and improving the conversion efficiency of the solar cell.

In this embodiment, the material of the first interface passivation sub-layer 621a is the same as a material of the second interface passivation sub-layer 621b, and both are formed by the same forming process. In other embodiments, the material of the first interface passivation sub-layer 621a may be different from the material of the second interface passivation sub-layer 621b.

In addition, when the material of the field passivation layer 623 is a doped polysilicon, an amorphous silicon or a monocrystalline silicon, a metal silicide may be formed by directly doping a metal material to serve as the conductive enhancement layer.

Figure 8:
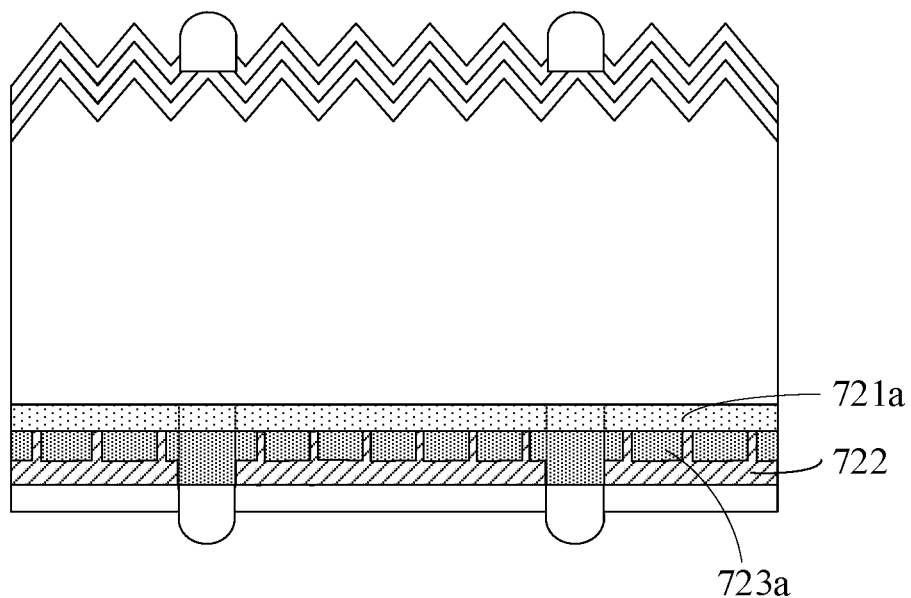
FIG. 8 is a schematic structural diagram of a solar cell according to the present disclosure.

In this embodiment, the exposed part of the surface of the first interface passivation sub-layer 621a is a continuous surface. In other embodiments, referring to FIG. 8, a first interface passivation sub-layer 721a may have a plurality of discontinuous local surfaces exposed by a first field passivation sub-layer 723a. A conductive enhancement layer 722 is in contact with the plurality of discontinuous local surfaces, so that carriers in the first interface passivation sub-layer 721a may be transmitted to the conductive enhancement layer 722 through a relatively short path.

In this embodiment, the conductive enhancement layer 622 has a field passivation capability, which is conductive to ensuring that any position on the rear surface of the substrate 60 is subjected to a field passivation, thereby ensuring a selective transmission of the carriers. Herein, the field passivation capability of the conductive enhancement layer 622 may be obtained by forming a positive charge and using a material with a band difference compared with the material of the substrate 60.

In this embodiment, since the resistivity of the material of the conductive enhancement layer is smaller than the resistivity of the material of the field passivation layer, the conductive enhancement layer serves as a path for the carriers in the first interface passivation sub-layer to flow to the electrode, which is conductive to enabling the carriers to flow to the electrode at a relatively fast rate with a relatively small loss, thereby improving the conversion efficiency of the solar cell.

Those skilled in the art should appreciate that the aforementioned embodiments are specific embodiments for implementing the present disclosure. In practice, however, various changes may be made in the forms and details of the specific embodiments without departing from the spirit and scope of the present disclosure. Any person skilled in the art may make their own changes and modifications without departing from the spirit and scope of the present disclosure, so the protection scope of the present disclosure shall be subject to the scope defined by the claims.

What is claimed is:

1. A solar cell, comprising:
   a substrate;
   an interface passivation layer on a rear surface of the substrate, wherein the interface passivation layer comprises a first interface passivation sub-layer and a second interface passivation sub-layer;
   at least one electrode disposed at a side of the interface passivation layer facing away from the substrate, the first interface passivation sub-layer is disposed between adjacent electrodes, and the second interface passivation sub-layer is disposed between the substrate and the at least one electrode;
   a field passivation layer, at least partially disposed between the interface passivation layer and the at least one electrode; and
   a conductivity enhancement layer, at least partially disposed at a side of the first interface passivation sub-layer facing away from the substrate, and configured to enable carriers in the first interface passivation sub-layer to flow to the at least one electrode, wherein a resistivity of a material of the conductivity enhancement layer is smaller than a resistivity of a material of the field passivation layer, and the resistivity of the material of the conductivity enhancement layer is smaller than 0.001 Ωcm;

wherein the conductivity enhancement layer is configured to cover at least part of a surface of the first interface passivation sub-layer facing away from the substrate, and the field passivation layer is configured to cover a surface of the conductivity enhancement layer facing away from the substrate.

2. The solar cell according to claim 1, wherein the field passivation layer is configured to cover a surface of the second interface passivation sub-layer facing away from the substrate; at least part of the conductivity enhancement layer is disposed between adjacent electrodes, and the conductivity enhancement layer is in contact with a side wall of the at least one electrode.

3. A solar cell, comprising:
- a substrate;
- an interface passivation layer on a rear surface of the substrate, wherein the interface passivation layer comprises a first interface passivation sub-layer and a second interface passivation sub-layer;
- at least one electrode disposed at a side of the interface passivation layer facing away from the substrate, the first interface passivation sub-layer is disposed between adjacent electrodes, and the second interface passivation sub-layer is disposed between the substrate and the at least one electrode;
- a field passivation layer, at least partially disposed between the interface passivation layer and the at least one electrode; and
- a conductivity enhancement layer, at least partially disposed at a side of the first interface passivation sub-layer facing away from the substrate, and configured to enable carriers in the first interface passivation sub-layer to flow to the at least one electrode, wherein a resistivity of a material of the conductivity enhancement layer is smaller than a resistivity of a material of the field passivation layer, and the resistivity of the material of the conductivity enhancement layer is smaller than 0.001 $\Omega\cdot$cm;
- wherein the field passivation layer is configured to cover a surface of the interface passivation layer facing away from the substrate, wherein the field passivation layer disposed between adjacent electrodes is a first field passivation sub-layer, and the conductivity enhancement layer is configured to cover at least part of the surface of the first field passivation sub-layer facing away from the substrate;
- wherein the at least one electrode is configured to penetrate through the conductivity enhancement layer and is in contact with the field passivation layer.

4. A solar cell, comprising:
- a substrate;
- an interface passivation layer on a rear surface of the substrate, wherein the interface passivation layer comprises a first interface passivation sub-layer and a second interface passivation sub-layer;
- at least one electrode disposed at a side of the interface passivation layer facing away from the substrate, the first interface passivation sub-layer is disposed between adjacent electrodes, and the second interface passivation sub-layer is disposed between the substrate and the at least one electrode;
- a field passivation layer, at least partially disposed between the interface passivation layer and the at least one electrode; and
- a conductivity enhancement layer, at least partially disposed at a side of the first interface passivation sub-layer facing away from the substrate, and configured to enable carriers in the first interface passivation sub-layer to flow to the at least one electrode, wherein a resistivity of a material of the conductivity enhancement layer is smaller than a resistivity of a material of the field passivation layer, and the resistivity of the material of the conductivity enhancement layer is smaller than 0.001 $\Omega\cdot$cm;
- wherein the field passivation layer is configured to cover a surface of the interface passivation layer facing away from the substrate, wherein the field passivation layer disposed between adjacent electrodes is a first field passivation sub-layer, and the conductivity enhancement layer is configured to cover at least part of the surface of the first field passivation sub-layer facing away from the substrate;
- wherein a groove is provided within the first field passivation sub-layer and the conductivity enhancement layer is configured to fill the groove.

5. The solar cell according to claim 4, wherein the conductivity enhancement layer comprises a first conductivity enhancement sub-layer and a second conductivity enhancement sub-layer disposed in sequence, the first conductivity enhancement sub-layer is configured to cover a surface of the groove, a contact resistance between the first conductivity enhancement sub-layer and the field passivation layer is smaller than a contact resistance between the second conductivity enhancement sub-layer and the field passivation layer, and a resistivity of the second conductivity enhancement sub-layer is smaller than a resistivity of the first conductivity enhancement sub-layer.

6. The solar cell according to claim 4, wherein the field passivation layer is configured to expose part of a surface of the first interface passivation sub-layer, the conductivity enhancement layer is in contact with the exposed part of the surface of the first interface passivation sub-layer, and the resistivity of the material of the conductivity enhancement layer is smaller than a resistivity of a material of the interface passivation layer.

7. The solar cell according to claim 5, wherein the first interface passivation sub-layer comprises a plurality of discontinuous local surfaces exposed by the field passivation layer, and the conductivity enhancement layer is in contact with the plurality of discontinuous local surfaces.

8. The solar cell according to claim 6, wherein the conductivity enhancement layer has a field passivation capability.

9. The solar cell according to claim 7, wherein the conductivity enhancement layer has a field passivation capability.

* * * * *